US006741124B2

(12) United States Patent
Lucas

(10) Patent No.: US 6,741,124 B2
(45) Date of Patent: May 25, 2004

(54) DIFFERENTIAL GAIN ADJUSTING AMPLIFIER SYSTEM WITH SELECTABLE ELECTROLUMINESCENT DIFFERENTIAL PHOTOCELL ATTENUATION

(76) Inventor: Robert J. Lucas, 7 N. Louis St., Mt. Prospect, IL (US) 60056

( * ) Notice: Subject to any disclaimer, the term of this patent is extended or adjusted under 35 U.S.C. 154(b) by 0 days.

(21) Appl. No.: 10/078,959

(22) Filed: Feb. 20, 2002

(65) Prior Publication Data

US 2003/0155968 A1 Aug. 21, 2003

(51) Int. Cl.$^{7}$ .......................... H03F 17/00; H01J 40/14
(52) U.S. Cl. ...................... 330/59; 330/308; 250/214 A
(58) Field of Search ........................... 330/59, 69, 144, 330/308; 250/214 A

(56) References Cited

U.S. PATENT DOCUMENTS 3,258,707 A 6/1966 Lawrence, Jr. ............... 330/59
5,355,242 A * 10/1994 Eastmond et al. ............ 330/59
5,477,370 A * 12/1995 Little et al. .................. 330/59

* cited by examiner

*Primary Examiner*—Nguyen Khanh Van
(74) *Attorney, Agent, or Firm*—Schiff Hardin LLP

(57) ABSTRACT

An audio attenuator has a differential signal path with photoconductive cells connected to vary signal levels in the circuit. Electroluminescent light sources adjacent to the photoconductive cells direct light onto the photocells. The electroluminescent light sources receive the input audio signal, an output audio signal, or some other signal. The light sources are connected to a differential control with receives an input of the attenuator circuit. The differential control provides a control input to a differential audio amplifier which receives the input audio signal. The varying signal at the control input effects a variation in the gain of the amplifier. A compression or limiting of the input signal results, depending on which signal is connected to the light sources.

14 Claims, 10 Drawing Sheets

OUTPUT
C.T.
ACM - 3
W1
S7
W2
1
2
3
4
R31A
R31B
R32A
R32B
B12
B10
B9
B11
LS6
LS5
R30
R29
VRB-3
LDR-G
LDR-H
N5
N6
R27
R28
SW7
SW8
T4
PW
C.T.
INPUT

ACM - 4
OUTPUT
C.T.
INPUT
C.T.
PW
$T_5$
$SW_9$
$SW_{10}$
$RD_3$
$RD_4$
$N_7$
$N_8$
$R_{33}$
$R_{34}$
$R_{35}$
$R_{36}$
$R_{37}$
$R_{38}$
LDR-I
$LS_7$
$LS_8$
$R_{39A}$
$R_{39B}$
$R_{40A}$
$R_{40B}$
$W_1$
$S_8$
$W_2$
1
2
3
4

INPUT
OUTPUT
1
2
3
DIFFERENTIAL PHOTOCONDUCTIVE VARIABLE ATTENUATOR
DIFFERENTIAL AUDIO SYSTEM AMPLIFIER
DIFFERENTIAL CONTROL AMPLIFIER SELECTABLE VARIABLE FREQUENCY / AMPLITUDE LIGHT SOURCES

1. = GNU
2. = N/C
3. = N/C
4. = NON-INVERT LDR
5. = INVERT LDR
6. = METER LDR
7. = N/C
8. = E.L. DRIVE VOLTAGE
1 2 3 4 5 6 7 8
LDR-A
LDR-B
LDR-C
EL-02
EL-01
R66
R67
R60
R61
R62
R63
R64
R65
SW6
SW5
C.C.1
PIN NO. 4
PIN NO. 5
PIN NO. 8
PIN NO. 6
PIN NO. 1

DIFFERENTIAL GAIN ADJUSTING AMPLIFIER SYSTEM WITH SELECTABLE ELECTROLUMINESCENT DIFFERENTIAL PHOTOCELL ATTENUATION

BACKGROUND OF THE INVENTION

1. Field of the Invention

The present application relates generally to a photo-optically controlled differential variable voltage attenuator and, more specifically, to a differential amplifier system incorporating a selectable electroluminescent differential photocell attenuator array which is used to vary an input gain of a differential amplifier system as a function of the output voltage.

2. Description of the Related Art

It is well known in audio frequency compression/limiting amplifiers to vary the gain of the amplifier relative to the amplitude of the audio signal being amplified. The gain is usually reduced when the input signal is excessively large and increases when the input signal becomes smaller. The gain of most compression and limiting amplifiers is controlled by a control voltage which is utilized to vary the amplification of one or more amplifier stages within the total amplifier system. The level sensing control voltage is usually developed from a rectified portion of either the input voltage (for limiting applications) or the output voltage of the amplifier (for compression applications). The control voltage is used to vary the bias of another amplifier stage so that the amplification or gain of the second amplification stage decreases when the input signal increases.

In general, compressors and limiters are amplifiers whose gain can be automatically varied as a function of the signal level; the higher the signal, the lower the gain. In the recording of electronic sound impulses, for example, music recording, some type of automatic limiting control system is required to prevent over-modulation of the recording medium or of the audio channel in use. A level control is effected by utilizing varying bias techniques within audio amplifiers, but this increases the distortion in the gain controlling amplifier stage because the optimum linear operating state of the amplifier is constantly being shifted.

An important aspect of signal limiting circuits is that the change in gain should not be audible to the listener as distortion of the signal or as an undesirable modulation of the signal envelope. This means that the circuit should have fast response times to audio signal peaks for efficient control of the amplifier system. When the bias signal is varied to either increase or decrease the audio amplification level, proper consideration of the attack time and release time constants of the components involved is required to obtain a rapid increase or decrease in amplification.

SUMMARY OF THE INVENTION

The present invention provides a gain adjusting amplifier which attenuates or compresses signals utilizing a differential compression circuit. The present invention also provides a compression or attenuation amplifier having compression controlled by detecting varying light levels of light sources driven by the input signal, output signal or some other signal.

The present attenuation differential gain adjusting amplifier system combines an electro-optical differential attenuator network, a differential audio amplifier, a differential control amplifier, and variable frequency/amplitude light sources. One or more photoresponsive cells is placed in proximity to one or more luminescent sources. The light sources are connected to respond to the input signals, or to the output signals, or some other signal. These light sources respond to the amplitude and/or the frequency of the signal to produce a light signal. The light signal is detected by the photoresponsive cells and cause the photoresponsive cells to provide a signal that is fed to the differential control amplifier. The control amplifier provides a control signal to the audio amplifier, which thereby varies the gain of the amplifier. The audio amplifier also receives the input audio signal and generates an output which is varied according to the changing gain of the circuit to effect a compression or limiting of the input signal.

DETAILED DESCRIPTION OF THE PREFERRED EMBODIMENTS

Figure 1:
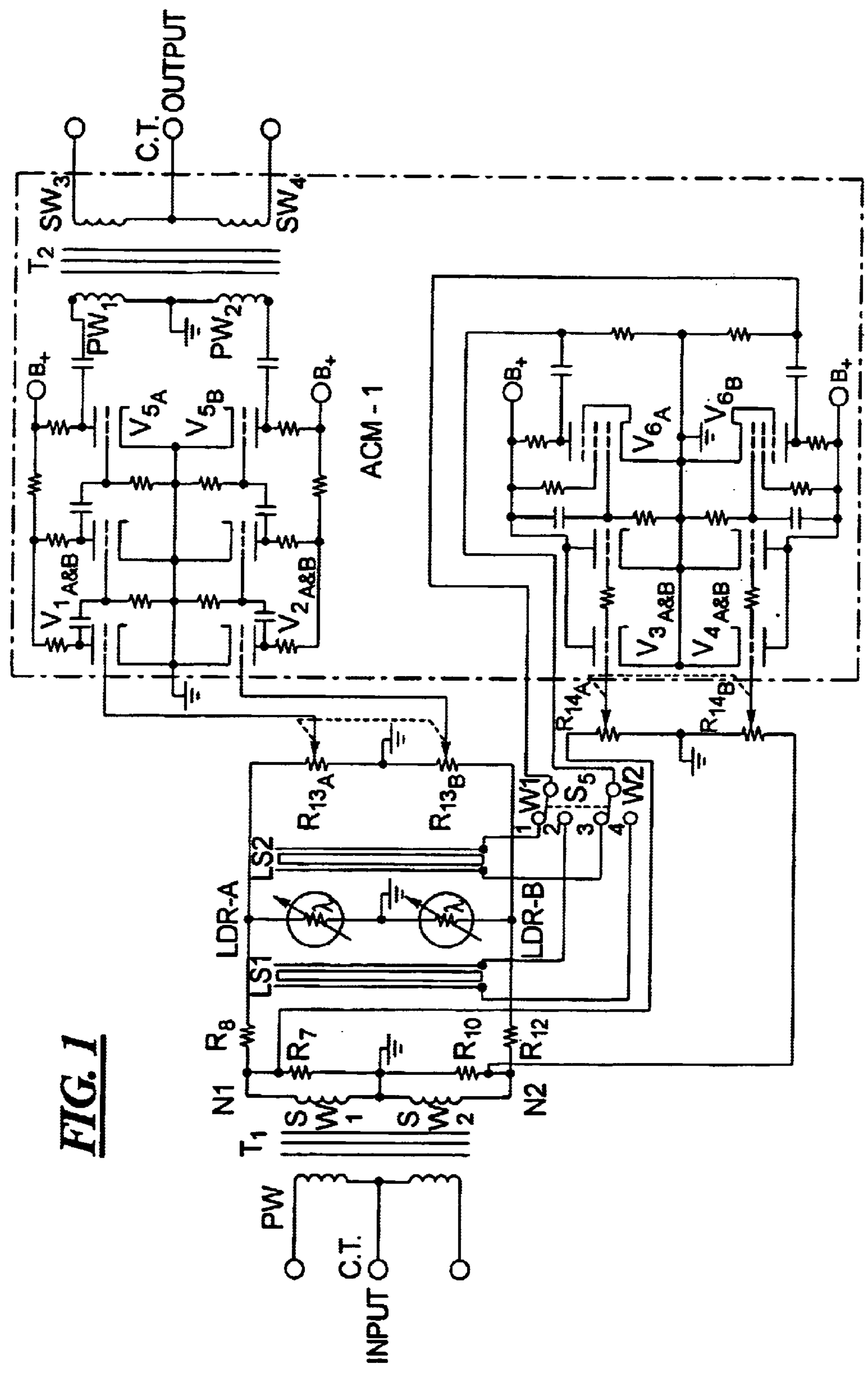
FIG. 1 is a circuit diagram of a differential gain adjusting amplifier according to the principals of the present invention.

In general, an automatic selectable variable differential gain adjusting amplifier system is provided in which large amounts of attenuation or compression of the audio signal being amplified are controlled with little or no increase in distortion which would otherwise lead to undesirable modulation artifacts of the original source signal. The present invention achieves this and other advantages through the use of a variable high gain control circuit which provides extremely fast operation and efficiency in controlling the level of the signal being amplified. The circuit is also independent of the direct audio signal path which removes any possibility of creating any unwanted signal artifacts.

The invention also provides a differential variable gain amplifier system in which variation of the amplifier bias for gain control is not used so that the disadvantages of such an arrangement are not present in the present invention.

Another advantages of the invention is to provide a differential variable gain amplifier system which achieves large amounts of compression or attenuation of the audio signal being amplified.

A further advantage of the invention is to utilize differential attenuation and amplification techniques rather than a single ended unbalanced electronic system. The balanced electronic format of the present invention provides a system with a higher gain and a lower distortion than is achievable in the known devices.

The invention provides a differential gain adjusting amplifier system with a combination of a selectable electro-optical differential attenuator network, a differential audio amplifier, a precision differential control amplifier, and selectable variable frequency/amplitude light sources.

An audio input signal is applied to the present amplifier through an electro-optical differential attenuator network which includes two or more selected matched photoconductive cells strategically placed in extremely close proximity to selectable variable frequency/amplitude light sources. The amplifier system produces an amplified output signal which is derived from the input audio signal. Either the input signal or the output signal which is selected for either leveling or compression configurations is also used as a direct control signal for a three stage voltage amplifier which provides a voltage for illuminating the selectable variable frequency/amplitude light sources. The selectable variable frequency/amplitude light sources are low powered solid state electroluminescent devices which have unique instantaneous light response variations in luminous intensity and wave length which is dependent on amplitude and frequency of the voltage applied. The electroluminescent light sources produce a varying light output which varies the internal resistances of the differential photoconductive network by means of photoconductive cells which in turn vary the audio input signal with reference to the light output from the variable light sources. The increased light output from the variable light sources causes the differential photoconductive network to reduce the audio input signal provided to the amplifier system. A decreased light output increases the input audio signal. The overall result is that the gain of the system is reduced as the input audio signal increases, and the gain of the system increases with decreases in the input audio signal.

The selectable electroluminescent differential photocell attenuator array includes two or more alternating current excited electroluminescent light sources along with the two or more light dependent resistors which are differentially configured. These can be individually selected or can be combined in parallel electrically. The electroluminescent light sources and light dependent resistors are selected from components available on the market based on their spectral source output content along with their resistive spectral sensitivity. By selecting different combinations of light sources and sensors, the user can provide various attack and release speeds of the audio input signal being controlled by the attenuator array.

The present invention which utilizes at least two light sources and two photo electric cells provides a balanced configuration which eliminates the harmonic distortion and noise that would be present in an unbalanced system having a single light source and single photocell configuration.

The present apparatus is configured by selection of electroluminescent light sources and photoconductive cells for close matching of resistances to provide a balanced differential audio throughput. In a practical design, the light sources may be individually selected or combined together for multiple selectivity. The photoconductive cells are treated in the practical design as individual pairs or as combined parallel light dependent resistors. This does not limit the possibility of different individually selectable electroluminescent light sources and photocells.

The photocells may be selected, just as the electroluminescent light sources, in a single mode or multiple combined modes. Off the shelf manufactured devices may be utilized for practical cost considerations. Manufacturers of both light sources and photoconductive cells provide lateral design potential for custom devices which are not available in standard component lines.

An inverse control is achieved in the present invention with a modification of the selectable differential photocell attenuator array which causes the gain of the amplifier system to be increased with an increase in audio input signal and decreased with a decrease in the audio signal input. This configuration is known as a noise gate or an expander circuit.

With reference first to FIG. 1, an audio input voltage is applied to a primary winding PW of an input transformer T1. The primary winding PW is a split winding having a center tap CT. The input audio voltage is transformed by the transformer T1 and appears across a secondary winding of the input transformer T1. The secondary winding of the transformer T1 is split to provide split windings SW1 and SW2, and resistors R7 and R10 are connected across the respective split windings. The resistors R7 and R10 are each of a value of 40 kilohms and serve as a voltage divider with reference to ground. A center tap of the split windings SW1 and SW2 is also referenced to ground potential to provide a direct method of phase splitting for exciting the differential throughput of the amplifier system.

The resistive voltage divider made up of the resistors R7 and R10 provide a constant load on the input of the transformer T1 to maintain a proper transformer primary impedance. A resistors R8 and a light dependent resistor LDR-A along with a resistor R12 and a light dependent resistor LDR-B are connected in a dual series combination across the secondary windings SW1 and SW2 of the transformer T1 to serve as dual voltage dividers. The output is applied to dual potentiometers R13A and R13B. The dual potentiometers R13A and R13B have wipers which are directed to control grids of tube amplifiers V1A and V2A, which are non-inverting and inverting first stages of amplification. The resistors R8 and R12 are of, for example, 68 kilohms in value and the light dependent resistors LDR-A and LDR-B are photoconductive cells whose resistance can range from many mega ohms without illumination to a few hundred ohms when they are fully illuminated. The voltages across the photoconductive cells LDR-A and LDR-B are applied to the two amplifiers V1A and V2A and are proportional to the resistance values of the photoconductive cells LDR-A and LDR-B since the resistors R8 and R12 remain constant in value.

The output voltages from the tube amplifiers V1A and V2A are further amplified by tube amplifiers V1B and V2B, and these outputs are further amplified by tube amplifiers V5A and V5B. The voltages from the tube amplifiers V5A and V5B are then applied to a center tapped primary windings PW1 and PW2 of an output transformer T2. Non-inverting audio signals from the tube amplifier V5A are applied to the primary winding PW1 of the transformer T2 and inverting audio signals are applied to the primary winding PW2 of the transformer T2. The center tap of the transformer windings PW1 and PW2 is referenced to ground to provide a balanced push-pull operation at the primary of the output transformer T2. The system output voltage signal is obtained from secondary windings SW3 and SW4 of the transformer T2.

A reference differential control voltage can be obtained from various points in the circuit, depending upon design configurations and considerations. With respect to FIG. 1, a differential control voltage is obtained from the combined output of electrical nodes N1 and N2. The node N1 is at one of the output leads of the secondary winding SW1 of the primary transformer T1 at the junction of the resistors R7 and R8. This node provides a non-inverted control voltage and is applied to one leg R14A of a dual potentiometer R14A and B. The potentiometer R14A has a wiper which is connected directly to a control grid of a tube amplifier V3A and B. The second node N2 for access to the control voltage is at a mirror image of the node N1 and is provided at the opposite leg of the secondary winding SW2 of the primary transformer T1 at the junctions of the resistors R10 and R12. This second node N2 provides an inverted control voltage which is applied to the other leg R14B of the dual potentiometer R14A and B. The dual potentiometer leg R14B has a wiper which is directly connected to the control grid of the vacuum tube V4A and B. Differential output voltages of the vacuum tubes V3A and B and V4A and B are applied to control grids of a vacuum tube V6A and B for further amplification.

Upon final amplification of the differential control signal, the differential voltage is directed for its final destination to wipers of a selector switch S5. The switch S5 is a double pole, double throw switch, the poles thereof being directly connected to variable frequency/amplitude light sources LS1 and LS2. In particular, poles 2 and 4 are connected to the variable frequency/amplitude light source LS1, and the poles 1 and 3 are connected to the variable frequency/amplitude light source LS2. The inverting output voltage of the vacuum tube V6B is connected to the first pole W1 of the selector switch S5. The non-inverting output voltage of the vacuum tube V6A is connected to a second pole W2 of the selector switch S5.

It is also contemplated that the switch S5 could be two individual switches to permit selection of either light source LS1 or LS2, or both. The user may thereby select the gain limiting factor of the device or other operating characteristic.

It is preferred that the selectable variable frequency/amplitude light sources LS1 and LS2 are low powered solid state electroluminescent devices or other light powered linear light sources having a near instantaneous response to an applied voltage amplitude and frequency. The light sources LS1 and LS2 are located in extremely close proximity to the photoconductive cells LDR-A and LDR-B so that the photoconductive cells LDR-A and LDR-B are exposed to the light from the selectable variable frequency/amplitude light sources LS1 and LS2. The light emission of these devices is dependent upon the output voltages developed from the vacuum tubes V6A and V6B. It is therefore proportional to the amplified differential voltages of the tube V5A and B. Since the output of the tube V5A and B is connected to the output transformer T2, the light output of the selectable electroluminescent devices LS1 and LS2 is also proportional to the system's input signal from the secondary windings SW1 and SW2 of the input transformer T1. When the transformer T1's audio signal input is increased, the stepped-up voltage from the secondary windings SW1 and SW2 also cause amplified differential control voltages from the tube V6A and B. Since the differential output voltages of the tube V6A and B are routed to the selectable variable frequency/amplitude electroluminescent elements LS1 and LS2, the increase in the illumination will reduce the resistance of the photoconductive cells LDR-A and LDR-B in such a way that a lower differential voltage is applied to the tubes V1 and V2. The amplified differential output voltages from the tubes V5A and V5B and from the output transformer secondary windings SW3 and SW4 will not be increased to the full amount when an increase in the input audio voltage is injected into the primary winding of the input transformer T1. The throughput gain of the differential amplifier system is thus reduced for increases in audio input signal. Conversely, the gain increases as the audio input signal level decreases. An adjustment setting of the dual potentiometer R14A and R14B provides a user control on the amount of gain reduction through the entire differential amplifier system.

In the preferred embodiment, the components are configured and mounted in a sealed cast aluminum chassis to avoid effects from external light sources. The electro-luminescent sources and the light dependent resistors are coupled in extreme close proximity to one another to form what is termed an optical sandwich. The mechanical configuration along with the switches for providing electro-optical selection are also contained on the circuit chassis. The integral component forms the basis of the selectable electroluminescent differential photocell attenuator array which is the heart of the precision differential gain adjusting amplifier system described herein.

The portion of the circuit of FIG. 1 forms an amplifier control module ACM-1. The same construction is used in subsequent described embodiments and so is not repeated. Of course, other constructions of the amplifier control module are also possible.

Figure 2:
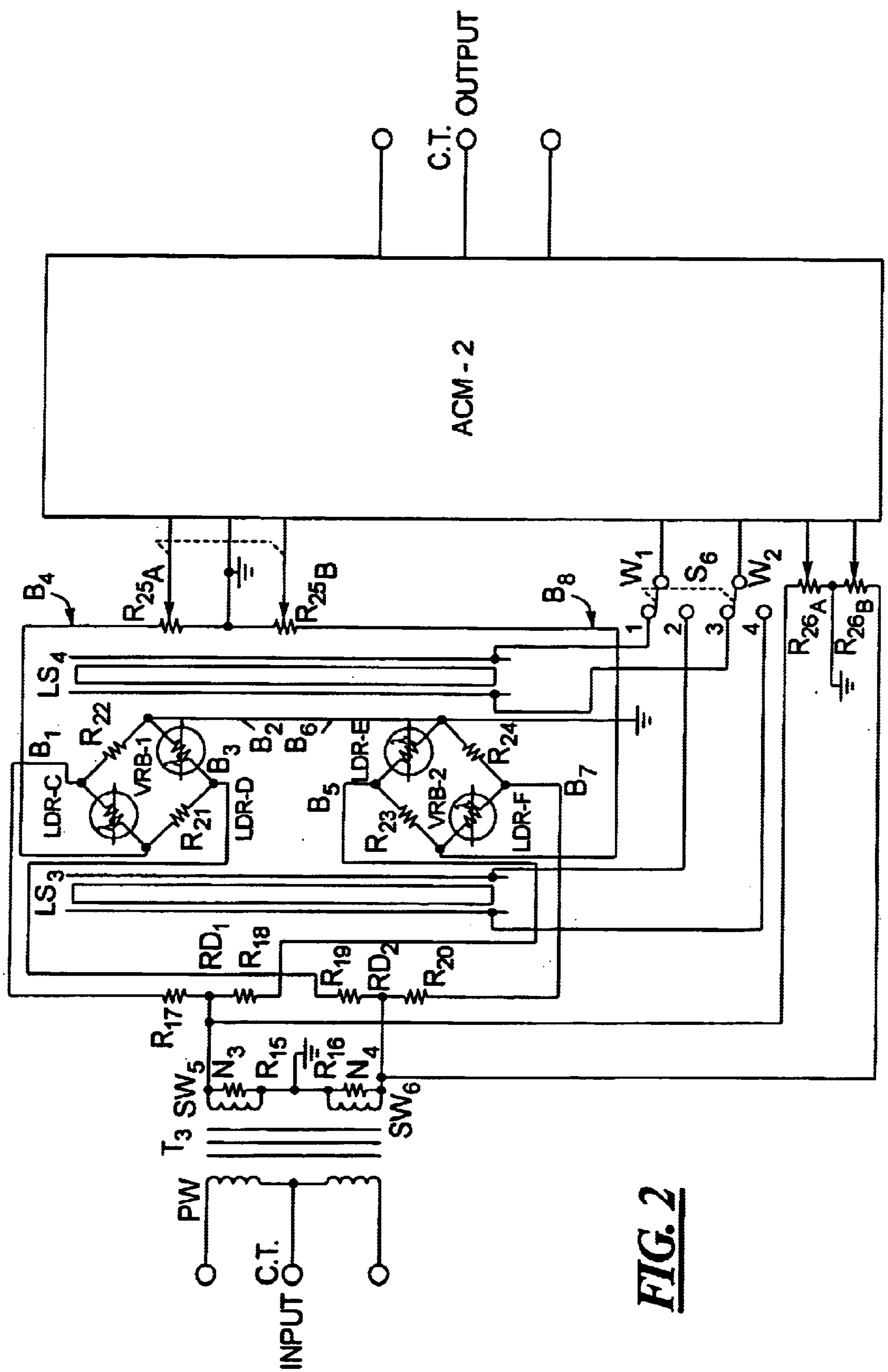
FIG. 2 is a circuit diagram of a second embodiment of the present differential gain adjusting amplifier.

Turning now to FIG. 2, a second embodiment of the invention includes four photoconductive cells to provide a dual balanced bridging differential attenuator circuit. In the second embodiment, selectable variable frequency/amplitude light sources provide increased attenuation and sensitivity with a capability of completely attenuating a differential audio input signal and without being limited by resistive values of the photoconductive cells selected for use. Specifically, an audio input transformer T3 in FIG. 2 is the same as the audio input transformer T1 of FIG. 1. The audio input voltage is applied to a primary winding PW of the audio input transformer T3, which then appears across the secondary winding. Resistors R15 and R16 are connected across the split secondary winding SW5 and SW6 and are of the same resistance value as the resistors R7 and R10 in FIG. 1. The second embodiment provides voltage nodes N3 and N4 corresponding to the nodes N1 and N2 in FIG. 1 differential control voltages drawn from the nodes N3 and N4 are connected in the same manner as FIG. 1 to a dual control potentiometer R26A and R26B. The potentiometer R26A and R26B has wipers which are connected along the same electrical routing as in the first embodiment to a control amplification circuit within an amplifier control module ACM-2. The control module ACM-2 is identical to the module ACM-1 shown in the first embodiment and so has not been shown here for the sake of simplicity. The audio output voltages obtain from an output transformer as indicated at the output of the control module ACM-2, which corresponds to the output transformer T2 of the control module ACM-1 of the first embodiment.

In a manner similar to the first embodiment, the second embodiment has selectable variable frequency/amplitude light sources LS3 and LS4 which are connected electrically to a selector switch S6 in the same fashion as the selector switch S5 of the first embodiment. The light sources LS3 and LS4 are mechanically positioned in close proximity to four photoconductive cells LDR-C, LDR-D, LDR-E, and LDR-F and thereby provide substantially equal illumination to the photoconductive cells. Lower levels of illumination are required from the selectable variable frequency/amplitude light sources to provide a maximum attenuation by the circuit. In particular, from the nodes N3 and N4, node N3 supplies a non-inverted voltage to the junction of the resistive voltage divider RD1. The divider RD1 includes the resistors R17 and R18 which have a nominal value of 10 kilo ohms. The resistor R17 receives the divided non-inverting voltage and directs it to a branch leg B1 of a first variable resistive bridge VRB-1. The resistor R18 transmits the divided non-inverted voltage to a second variable resistive bridge VRB-2 at branch leg B5. The node N4 supplies the inverted voltage to the junction of a resistive voltage divider RD2 which is made up of resistors R19 and R20 that have the same resistive values as the resistors R17 and R18. The resistor R19 divides the inverted voltage and directs to a branch leg B3 of the first variable resistive bridge VRB-1. The resistor R20 divides the inverted voltage and applies it to a branch leg B7 of the second variable resistive bridge VRB-2.

The variable resistive bridges VRB-1 and VRB-2 include resistors R21, R22, R23 and R24 which are of equal but small value to maintain bridge balances. The branch B2 of the first variable resistive bridge VRB-1 and the branch B6 of the second variable resistive bridge VRB-2 forms a common ground node which is referenced to a center tap of an audio input transformer T3. The audio input transformer T3 has the secondary windings SW5 and SW6. A connection is then made through the ground node of resistors R25A and R25B to the control module ACM-2. The non-inverted voltages is directed to one leg R25A via a branch B4 of the first variable resistive bridge VRB-1 and the inverted voltage is directed in the opposite manner to the leg of the resistor R25B via a branch B8 of the second variable resistive bridge VRB-2.

The foregoing configuration provides a single-phase 3-wire system providing truly balanced controllable variable attenuation to the differential input of the control module ACM-2. As the input audio voltage which is injected into the input transformer T3 is increased, a greater differential output voltage is provided from the dual potentiometer R25A and R25B which tends to increase the amplified audio output signal from the amplifier control module ACM-2. As previously mentioned, however, the light emission from the selectable variable frequency/amplitude light sources LS3 and LS4 is increased to reduce the overall resistances of the photoconductive cells LDR-C, LDR-D, LDR-E and LDR-F. The overall result is that the differential audio input voltage from the dual potentiometer R25A and R25B is reduced according to a desired amount through the adjustment of the potentiometer R26A and R26B of the control module ACM-2. The gain throughput of the differential amplifier system is reduced with an increase of the audio input signal at the primary winding PW of the input transformer T3 and is increased when the audio signal level decreases.

When the increase in the audio input voltage to the input transformer T3 is such that the illumination output of the selectable variable frequency/amplitude light sources LS3 and LS4 is increased to a point where the resistances of the photoconductive cells LDR-C and LDR-D of the first resistive bridge VRB1 becomes equal to that the resistors R21 and R22 and also the resistance of the photoconductive cells LDR-E and LDR-F of the second resistive bridge VRB-2 becomes equal to that of the resistors R23 and R24, then the two bridges are equally balanced and the differential voltage applied to the dual potentiometer R25A and R25B approaches zero. The value of the resistors R21, R22, R23 and R24 of the resistive bridges VRB-1 and VRB-2 should be selected to be low enough that the resistances of all four photocells LDR-C, LDR-D, LDR-E and LDR-F never become less than that of the resistors. Otherwise, an imbalance or phase shift reversal of both bridge attenuators will be created when very high illumination outputs are applied to the photoconductive cells.

The audio output signal from the amplifier control module ACM-2 is thereby reduced to zero for very high levels of the audio input signal applied to the primary winding PW of the input transformer T3. Thus, an infinite attenuation can be achieved even though the resistances of the photoconductive cells LDR-C, LDR-D, LDR-E and LDR-F have remained finite. The differential amplifier system of the second embodiment has a gain that is greatly reduced as increased audio input signals are being amplified. For very high audio input signals, the gain is effectively attenuated to zero so that no audio output signal will be obtained at the amplifier control module ACM-2 output.

Figure 3:
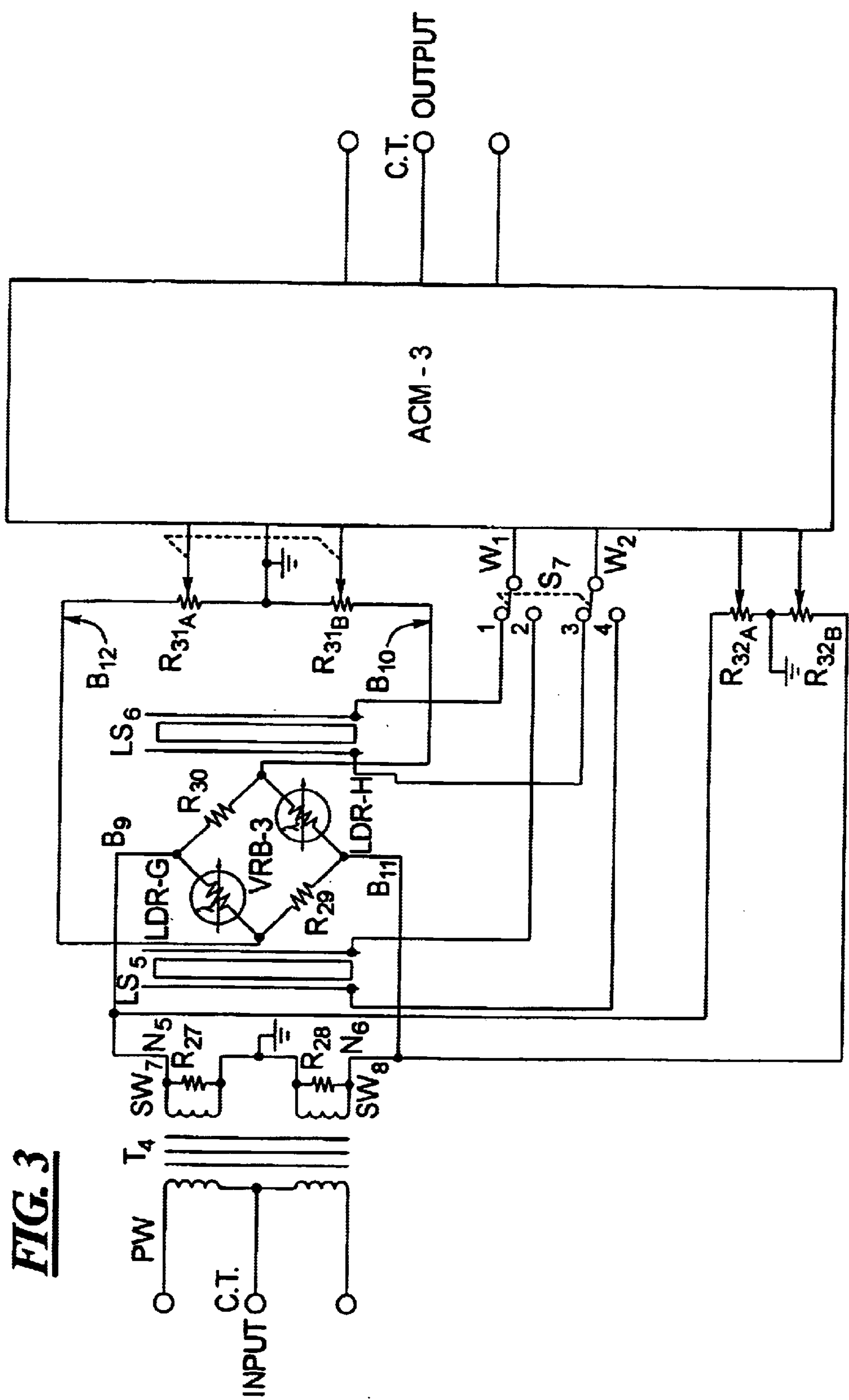
FIG. 3 is a circuit diagram of a third embodiment of the present differential gain adjusting amplifier.

A third embodiment of the invention is shown in FIG. 3 wherein two photoconductive cells are utilized to form a balanced bridge differential variable attenuator circuit. Through the use of selectable variable frequency/amplitude light sources and a balanced differential variable bridge, a circuit configuration is provided having increased attenuation sensitivity yet utilizing only two photocells. The circuit arrangement of the third embodiment has the capability of attenuating a differential audio signal voltage without being limited by the resistive properties of the photocells. With reference to FIG. 3, an audio input transformer T4 is the same as the transformer of the first two embodiments and accepts an audio input voltage at the primary winding PW of the transformer T4. The audio input signal is transformed in an identical manner to that shown in FIGS. 1 and 2 so that a transformed audio voltage is available at a secondary winding of the transformer T4. Resistors R27 and R28 are connected across the split secondary windings SW7 and SW8 of the transformer T4. The resistors R27 and R28 form a voltage divider with reference to ground and the center tap of the secondary windings SW7 and SW8 are also referenced to ground to fulfill the direct method of phase splitting. The resistors R27 and R28 provide a constant load on the input transformer T4 to maintain a proper primary impedance, as noted with respect to the first two embodiments.

In this third embodiment, a balanced variable bridge circuit having dual parallel branch connections B9 and B11 of a variable resistance bridge VRB-3 receive the transformed differential voltage directly from nodes N5 and N6 of the secondary windings. One branch of the balanced bridge circuit is formed by a series combination of a photoconductive cell LDR-G connected to an upper branch connection B9 and a resistor R29 connected to the lower branch connection B11. The second branch is formed from another series combination of a resistor R30 connected to the upper branch B9 and the second photoconductive cell LDR-H that is connected to the lower branch B11, thereby forming a symmetrical balanced bridge. A dual potentiometer R31A and R31B are connected to the center of the symmetrical branches. The potentiometer R31 a receives its voltage from branch connection B12 and the potentiometer R31B receives an opposite voltage from a branch B10. A floating resistive bridge configuration is provided when one leg of each resistive element of the dual potentiometer R31A and R31B are also referenced to ground. The output voltage from wipers of the potentiometer R31A and R31B are then directed to the amplifier control module ACM-3, corresponding to differential amplifiers V1A and V2A of the control module AMC-1 of FIG. 1.

The amplifier control module ACM-3 of FIG. 3 has an identical circuit configuration to the control module AMC-1 of FIG. 1 and so the details are not shown herein for the sake of simplicity. The control module ACM-3 has an audio output from which is obtained an audio output signal through a transformer secondary much like the transformer secondary T2 of the control module ACM-1 shown in FIG. 1. In similar fashion, selectable variable frequency/amplitude light sources LS5 and LS6 of FIG. 3 are similar to the light sources as shown in the first two embodiments. A selector switch S7 is exactly the same as the selector switches S5 and S6 of the previous embodiments. The light sources LS5 and LS6 are positioned in close proximity to the photocells LDR-G and LDR-H and so provide substantially equal illumination of these cells. In the present embodiment, as in the second embodiment, lower illumination levels can be utilized for the light sources to provide a maximum attenuation.

In this embodiment, the nodes N5 and N6 provide two branch connections for dual control potentiometers R32A and R32B in the same manner as described above. These potentiometers include wipers which direct the differential input control voltage to the first gain stages of the precision control amplifier in the same manner as shown in the first two embodiments. As the audio input voltage is increased across the input transformer windings T4, a greater differential output voltage from the dual potentiometer R31A and R31B tends to increase the amplified output signal from the amplifier control module ACM-3. As mentioned before, the light emission output from the selectable variable frequency/amplitude electroluminescent light sources LS5 and LS6 is increased to reduce the resistances of the photoconductive cells LDR-G and LDR-H.

The result of this is that the audio output signal voltage from the dual potentiometer R31A and R31B is reduced so that the amount of the increase in the amplified output signal from the amplifier control module ACM-3 is reduced by the desired amount as set by the dual control potentiometer R32A and R32B for an increase in the audio input voltage at the input of the transformer T4. Basically stated, the gain of the amplifier system is reduced for increased audio input signals injected into the transformer T4.

In operation, upon an increase in the audio input voltage at the input of the transformer T4, the light emission from the selectable variable light sources LS5 and LS6 is increased to a point where the resistance of photocell LDR-G is equal to the resistor R30 and resistance of the photocell LDR-H is equaled to the resistor R29. At this point, the bridge circuit illustrated is imbalanced and the audio voltage applied to the dual potentiometer R31A and R32B essentially goes to zero. The values of the resistors R29 and R30 are selected to be low enough so that the photocell resistances never go below the value of the resistors of the bridge, which would otherwise create a potential phase reversal or imbalance of the bridge with a large amount of illumination impinging upon the photocells. An infinite attenuation is achieved even though the resistances of the photo conductive cells LDR-G and LDR-H are finite. Thus, the gain of the differential amplifier system is reduced for increased audio input signals, and for large input signals the gain is effectively reduced to zero so that an audio output signal will not be obtained from the amplifier control module ACM-3.

Figure 4:
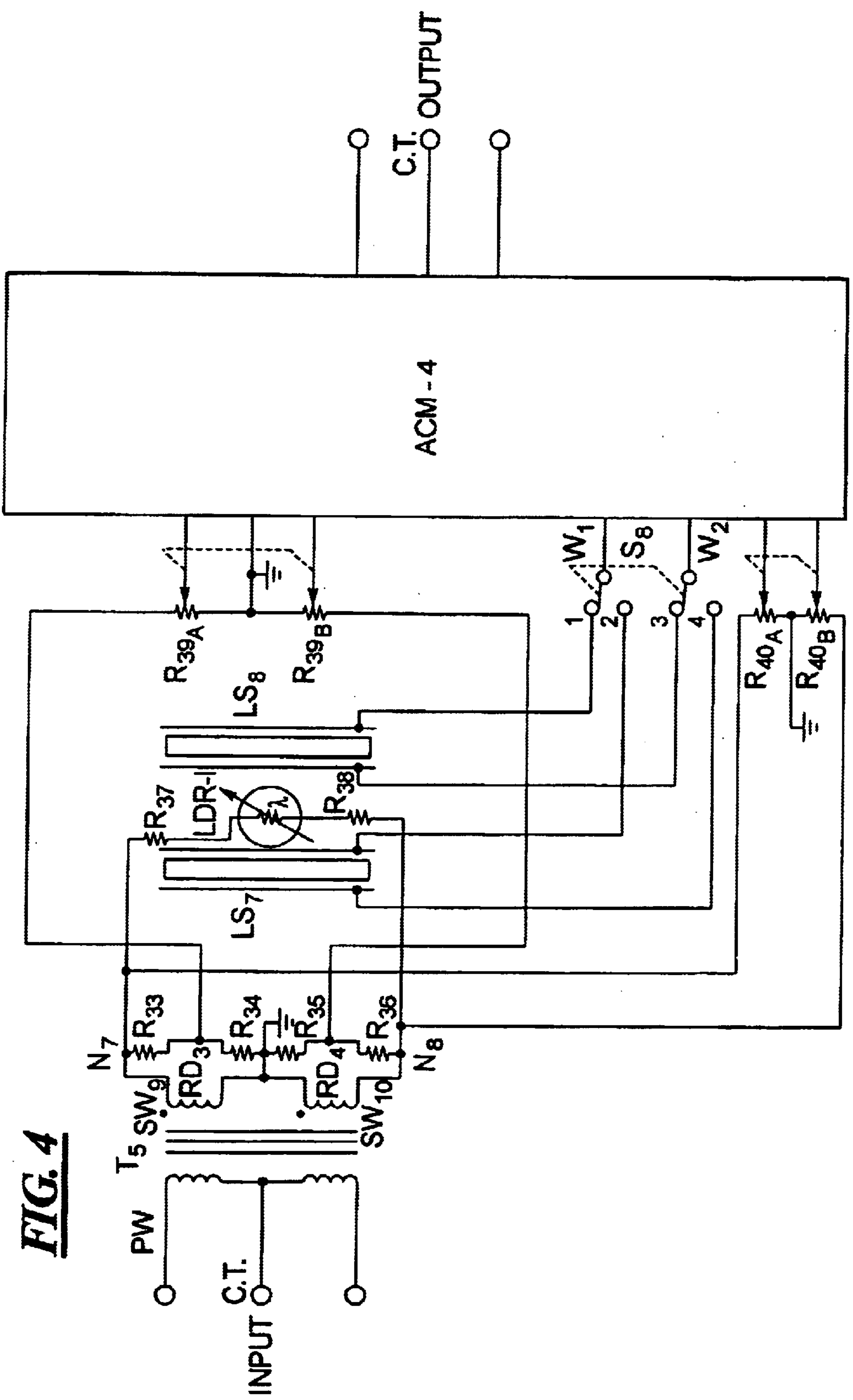
FIG. 4 is a circuit diagram of a fourth embodiment of the present amplifier.

A fourth embodiment of the invention is shown in FIG. 4 wherein a circuit is shown utilizing a method of differential voltage cancellation to obtain large values of attenuation for the differential audio signal yet only requires a single photoconductive cell. The input transformer T5 has a primary winding at a pair split secondary windings SW9 and SW10. A series combination of a resistor R37, a photoconductive cell LDR-1 and a resistor R38 are connected to the nodes N7 and N8 of the split secondary windings SW9 and SW10. A resistive divider RD3 and a resistive divider RD4 produces an approximately constant load on the input transformer T5 to maintain the proper transformer primary impedance. The voltage divider RD3 has resistors which are 20 kilo ohms resistors in series and is connected across the secondary winding SW9. A center tap branch for the resistive divider has a non-inverted voltage which is directed to one of the legs of a potentiometer R39A. The voltage divider RD4 has two resistors, each of a value of 20 kilo ohms which are connected in series across a secondary winding SW10. The center tap branch of the resistive divider provides an inverted voltage which is routed to one of the legs of a potentiometer R39B. The split secondaries SW9 and SW10 have a center tap which is referenced to ground. Dual potentiometers R39A and R39B are likewise connected to ground, once again fulfilling the differential phase splitting for the amplifier control module ACM-4. The potentiometer R39A has a non-inverted voltage which is directed to an amplifier tube V1A and the potentiometer R39B has an inverted voltage which is directed to an amplifier tube V1B (which are not shown for the sake of simplicity) but which are identical to those shown in FIG. 1. The amplifier control module ACM-4 is of an identical configuration as the control module AMC-1 of FIG. 1.

Nodes N7 and N8 supply differential voltages to the dual potentiometers R40A and R40B in the same manner as previously described. The center tapped secondary windings SW9 and SW10 are wound and connected so that the audio input voltage which is applied to the primary winding PW is transformed to a different voltage from end to end of the center tapped secondary windings SW9 and SW10. The voltages at the nodes N7 and N8 are applied across the series connection of the resistor R37, the photoconductive cell LDR-I and the resistor R38. When the selectable variable frequency/amplitude light sources LS7 and LS8 receive a voltage from the amplifier control module ACM-4, the selected light source begins to illuminate and the light output therefrom impinges upon the photoconductive cell LDR-I.

As can be seen, with a great amount of illumination on the photocell, the resistance approaches near zero ohms to provide a low resistive path across the nodes N7 and N8 to virtually cancel each node out. The net output of the nodes N7 and N8 approach zero, causing the center tapped outputs of the resistive dividers RD3 and RD4 to also produce a near zero voltage output to the potentiometers R39A and R39B. The variable frequency/amplitude light sources LS7 and LS8 are connected electrically in the same manner as shown in FIGS. 1–3 to a selector switch S8. The overall operation of the circuit is essentially similar to that shown above. When an audio input signal is applied to the input of the transformer T5, differential voltages appear at the ends of the center tapped secondary windings SW9 and SW10 with the center tapped referenced to ground. Loop voltages which differentially oppose through the dual secondary windings SW9 and SW10 and resistive dividers RD3 and RD4 are varied in magnitude with respect to their loop resistances and are differentially combined in the dual potentiometers R39A and R39B. Two independent voltage drops are the result across both of the potentiometers R39A and R39B. A differential output voltage from both control wipers is directed to the amplifier control module ACM-4 in the same manner as described with respect to the foregoing embodiments, so that an output signal is produced. The light output from the selectable variable frequency/amplitude light sources LS7 and LS8 is increased to reduce the resistance in the photoconductive cell LDR-I. A cancellation of the differential of the voltages across the nodes N7 and N8 results in a lowering of the resistance between the two nodes via the photocell LDR-I to produce a decreased differential output voltage from the potentiometers R39A and R39B such that the output signal is reduced by a desired amount at the output amplifier control module ACM-4. The gain of the amplifier is effectively reduced as input increases at the input of the primary winding PW of the transformer T5. When the audio signal input at the transformer is large enough to create an emission from the selectable variable electroluminescent light sources LS7 and LS8 which is increased through a point where the resistance of the photoconductive cell LDR-I is decreased so that its resistance in combination with the resistor R37 is near equal to the resistance R38, the differential voltage across the dual potentiometers R39A and R39B approaches zero, resulting in a greatly reduced output audio signal. The gain of the amplifier system of the embodiment shown in FIG. 4 thus is reduced as increased audio input voltages are received by the amplifier system and is increased with decreasing audio input voltages.

Figure 5:
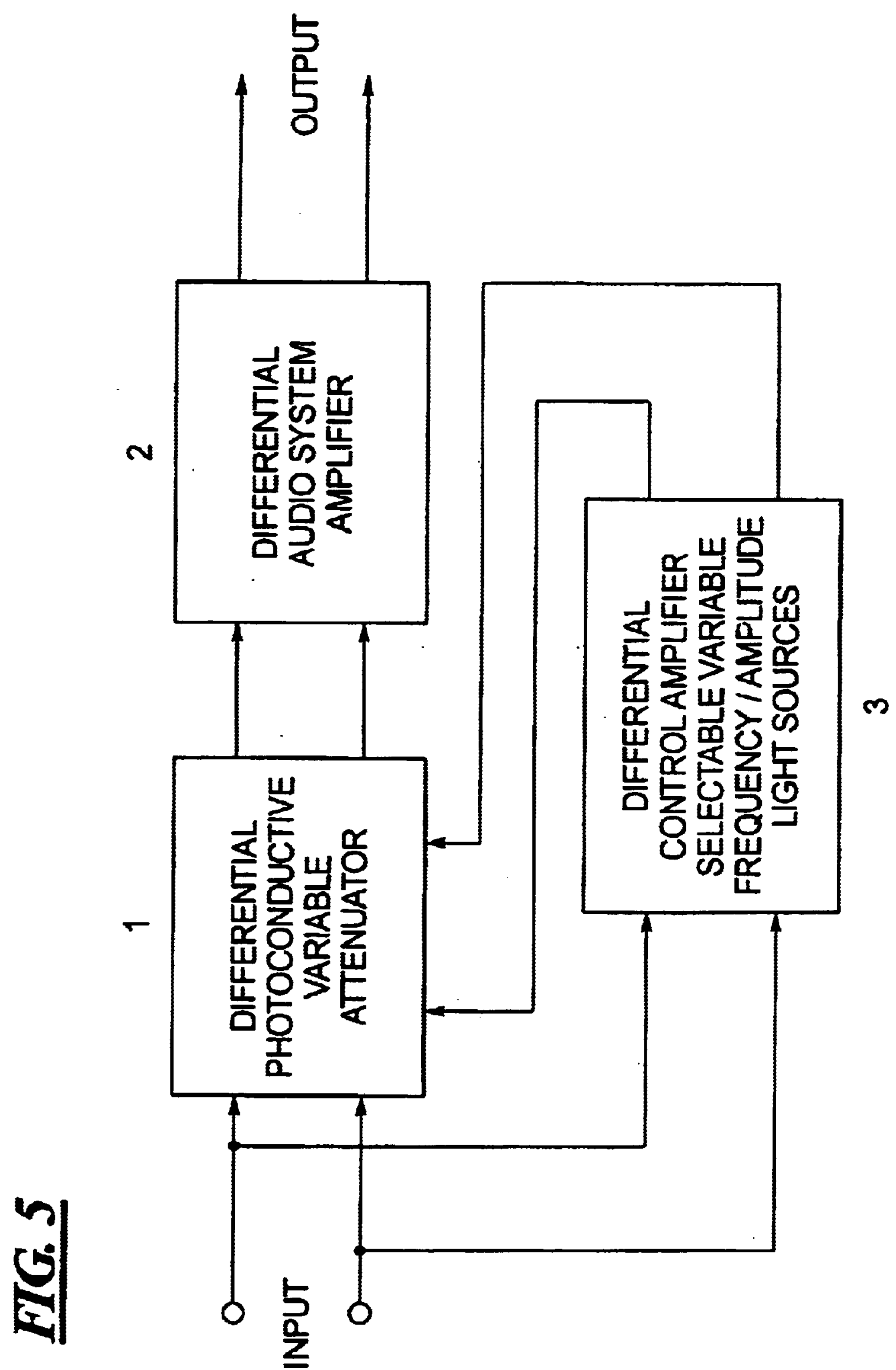
FIG. 5 is a functional block diagram of the differential gain adjusting amplifier of the present invention.

With reference to FIG. 5, which is applicable to all of the preceding four embodiments of the invention, an audio input signal is applied to a differential photoconductive variable attenuator block 1. The differential output of the variable attenuator block 1 is directed to a differential amplifier block 2 that produces an amplified differential output signal. The input signal is also routed to a differential control amplifier which illuminates the selectable variable frequency/amplitude light sources in block 3 to produce a signal that regulates the differential photoconductive variable attenuator block 1. This causes the output of the differential amplifier system block 2 to be adjusted according to the light output from the selectable variable light sources block 3. The light output from the selectable variable light sources block 3 is dependent upon the input of the variable attenuator block 1 and the output of the photoconductive network block 1 is varied accordingly.

The gain of the amplifier system is reduced by an increase in the audio input signal directed to the variable attenuator block 1 this is the result of an increased light output from the selectable variable frequency/amplitude light source block 3 which regulates the photoconductive variable attenuator block 1 to reduce the output from the variable attenuator block 1. This results in a reduced signal input to the differential amplifier system block 2 to produce a lower amplifier system output signal. As such, as the input signal is increased, an increasing attenuation is imposed on the output signal.

The differential photoconductive variable attenuator block 1 of FIG. 5 corresponds to the dual voltage dividers including the resistors R8 and R12 and the photoconductive cells LDR-A and LDR-B of FIG. 1. These elements in FIG. 2 include the dual variable resistance bridges VRB-1 and VRB-2 with resistors R21 and R22 and photoconductive cells LDR-C and LDR-D with reference to the resistance bridge VRB-1 and the resistors R23 and R24 and the photoconductive cells LDR-E and LDR-F for the variable resistance bridge VRB-2. In the embodiment of FIG. 3, the variable attenuator block 1 corresponds to the bridge circuit having the resistors R29 and R30 and the photoconductive cells LDR-G and LDR-H. The embodiment of FIG. 4 provides a variable resistive network connected to the center tapped windings of the transformer secondary windings SW9 and SW10 as well as resistors R37 and R38 and a photoconductive cell LDR-I which make up the variable attenuator block 1. Since the secondary windings of the input transformer T5 in FIG. 4 is a split secondary windings SW9 and SW10 with resistive dividers RD3 and RD4 which connect to the ends of dual potentiometers R39A and R39B, the differential photoconductive variable attenuator block 1 indicated in FIG. 5 also includes the secondary windings and resistive dividers of the fourth embodiment.

The input signal which is shown in FIG. 5 corresponds to the transformed voltage across the secondary windings of the input transformers T1, T3, T4 and T5 for the embodiments of FIGS. 1, 2, 3 and 4, respectively.

The differential amplifier system block 2 of FIG. 5 corresponds to the differential three stage amplifier having the tubes V1A and B, V2A and B and V5A and B for the amplifier control circuits ACM-1, ACM-2, ACM-3 and ACM-4 for the four embodiments of FIGS. 1–4.

The differential control amplifier with the variable frequency/amplitude light source block 3 of FIG. 5 corresponds to the three stage control amplifier tubes V3A and B, V4A and B and V6A and B which provide the differential drive voltages for the selectable electroluminescent light sources LS1, LS2, LS3, LS4, LS5, LS6, LS7 and LS8 of the embodiments of FIGS. 1–4.

It is possible to configure the differential photoconductive variable attenuator block 1 of FIG. 5 to increase the illumination output from the selectable variable frequency/amplitude light source block 3 to produce an increasing output from the differential amplifier block 2. This can be achieved by changing the relative positions of the resistors R8, R12 and the photoconductive cells LDR-A and LDR-B within the dual differential voltage divider shown in first embodiment.

Figure 6:
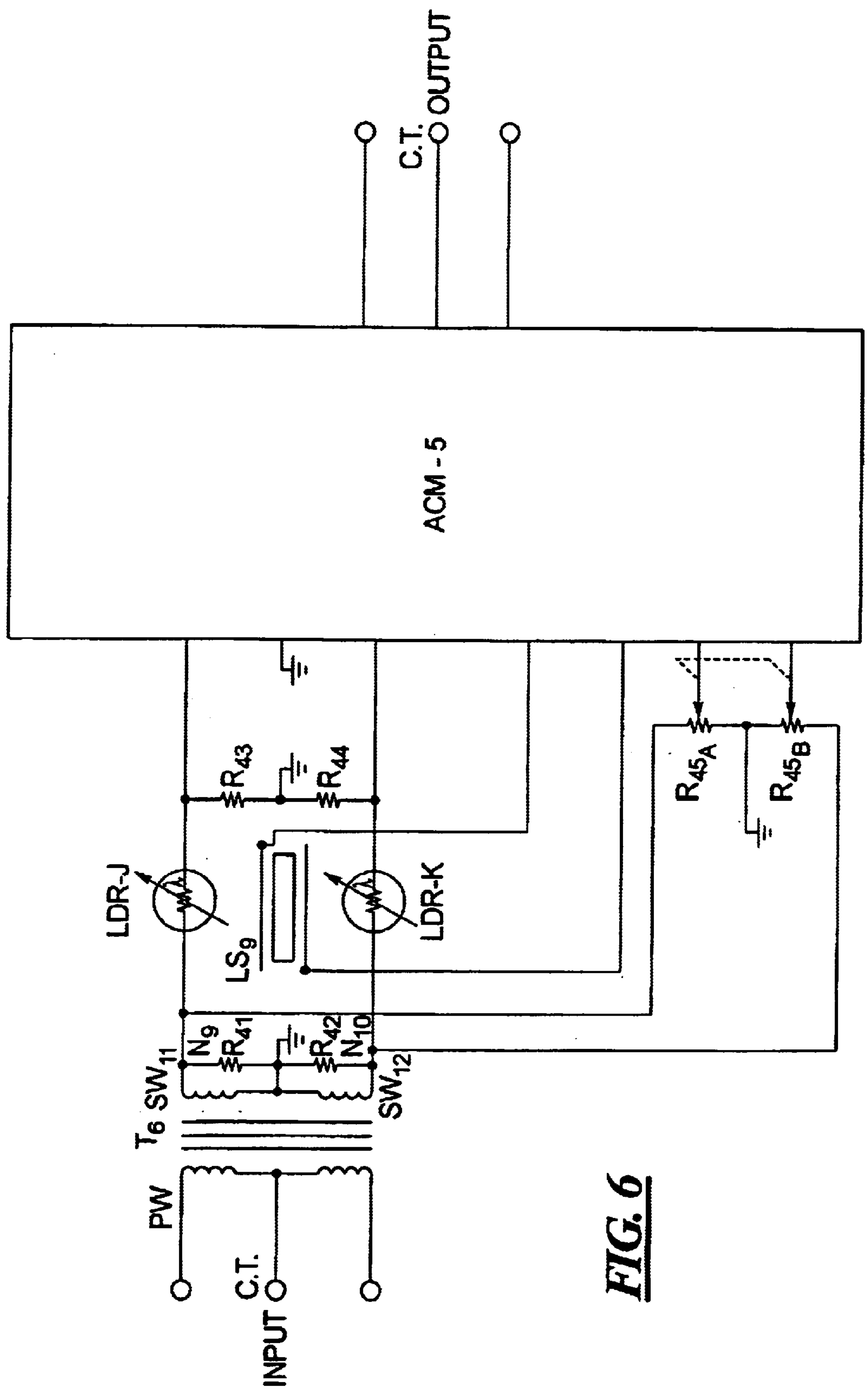
FIG. 6 is a circuit diagram of a variation of the amplifier shown in FIG. 1.

An alternative embodiment is shown in FIG. 6. A first photoconductive cell LDR-J is interchanged with a resistor R43, at a second photoconductive cell LDR-K is interchanged with a resistor R44, resulting in the circuit of FIG. 6. The photocells LDR-J and LDR-K and the resistors R43 and R44 are dual paired elements which have been interchanged. When the resistance of the photocells LDR-J and LDR-K is decreased with an increased illumination output from the electroluminescent light source LS9, the differential voltage across the resistors R43 and R44 increases to produce a greater output signal from the amplifier control module ACM-5. The circuitry of the amplifier control module ACM-5 is identical to the control module ACM-1 of FIG. 1. In the present embodiment, the gain of the amplifier system is increased with an increased audio input signal to the system. The amplified audio output signals from the amplifier control module ACM-5 will track in an upward manner for increases in the audio input signal applied to the input winding of the transformer T6. The transformer T6 has secondary windings SW11 and SW12 which provide an approximate differential control voltage for the potentiometers R45A and R45B for the electroluminescent drive circuitry to thereby provide a voltage to excite the light source LS9 within the differential photoconductive variable attenuator block. The amplifier system functions as an expander which increases the output signals through the amplifier system.

Figure 7:
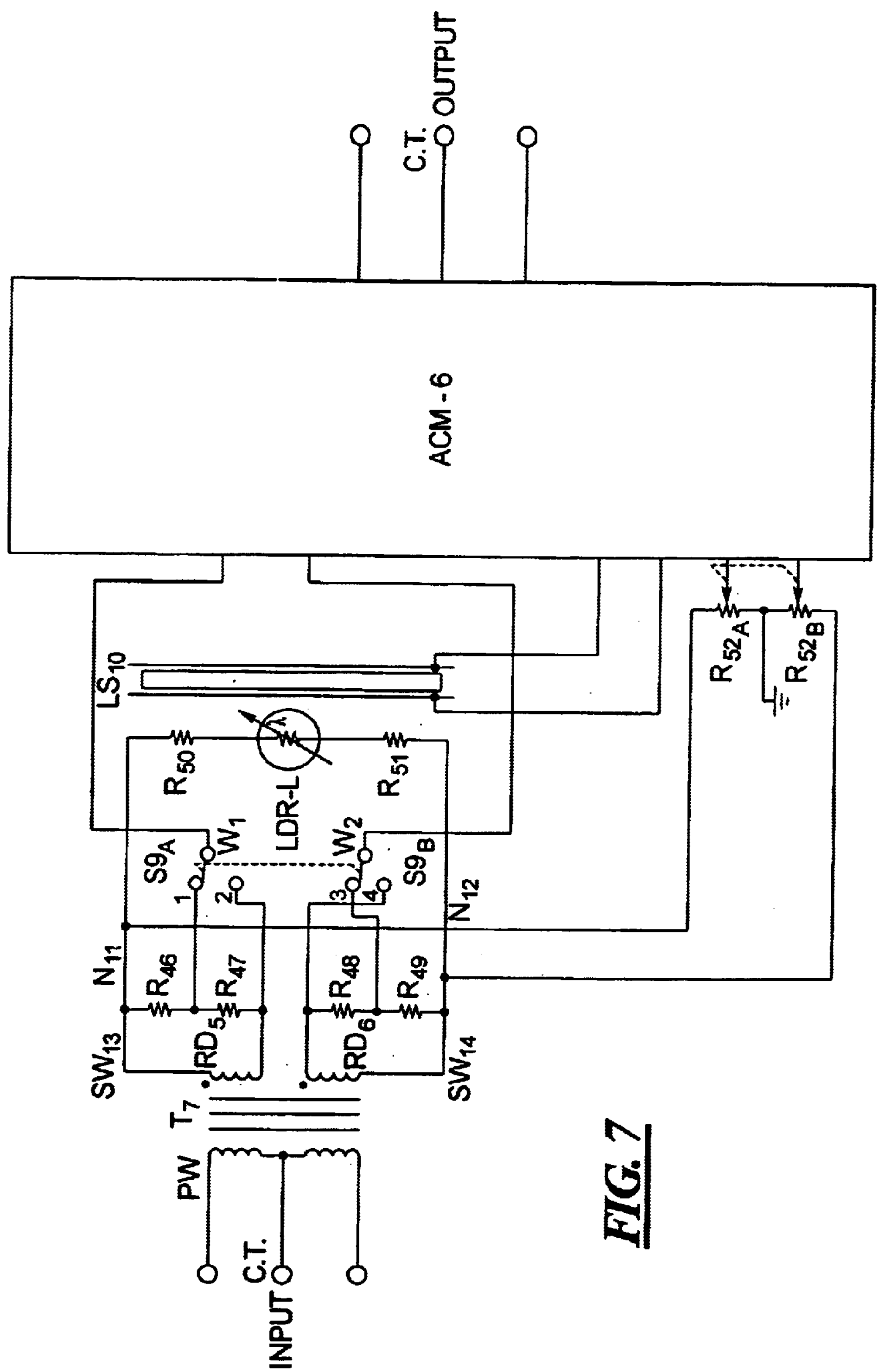
FIG. 7 is a circuit diagram of a differential gain adjusting amplifier as a variation on the circuit of FIG. 4 and representing a fifth embodiment of the invention.

In FIG. 7 is shown an alternative embodiment of the circuit shown in FIG. 4. In FIG. 7, secondary windings SW13 and SW14 along with resistive dividers RD5 and RD6, which is identical to the circuit arrangement of FIG. 4.

Where the circuit shown in FIG. 4 is differentially subtractive, by comparison the circuit shown in FIG. 7 is differentially additive. This is accomplished by the center tapped secondary windings SW13 and SW14 having the center tapped reference lifted. A series combination of a resistor R50, a photoconductive cell LDR-L and a resistor R51 which is connected to nodes N11 and N12 of the secondary windings SW13 and SW14 provide a light dependent variable resistor across the floating secondary windings SW13 and SW14. When an audio signal is input to the primary winding PW of the transformer T7, the transformed audio voltage appears across the secondary windings SW13 and SW14. This differential voltage is directed to the nodes N11 and N12 as control voltages for the dual control potentiometers R52A and R52B and is input to the amplifier control module ACM-6. The control amplifier once again provides an appropriate voltage to excite this single electroluminescent light source LS10, which emits light upon the photoconductive cell LDR-L which decreases in resistance to provide a low resistive path between the nodes N11 and N12. The secondary windings wired in this configuration with the resistive dividers RD5 and RD6 become the interconnecting branches for the input of the differential amplifier stages V1A and V1B of the control module ACM-6. Selector switches S9A and S9B provide a nominal selection of audio throughput via poles 1 and 3, the selector switches being connected to the center of the voltage dividers RD5 and RD6. By selecting poles 2 and 4 of the selectors switches S9A and S9B, an increase in throughput gain can be recognized by bypassing the resistive dividers. The selector switches S9A and S9B control wipers W1 and W2 which provide differential voltages directed to tubes V1A and V1B in the control module ACM-6. When the resistance is reduced across the photocell LDR-L by reducing the voltage across the secondary windings SW13 and SW14, the action becomes additive and the input signal routed to the differential amplifiers V1A and V1B increases.

In the circuit shown in FIG. 7, an increase in the audio input signal increases the gain of the differential amplifier system at the output of the control module ACM-6. The amplifier system thereby functions as an expander, which expands the input signals provided to the amplifier system.

Figure 8:
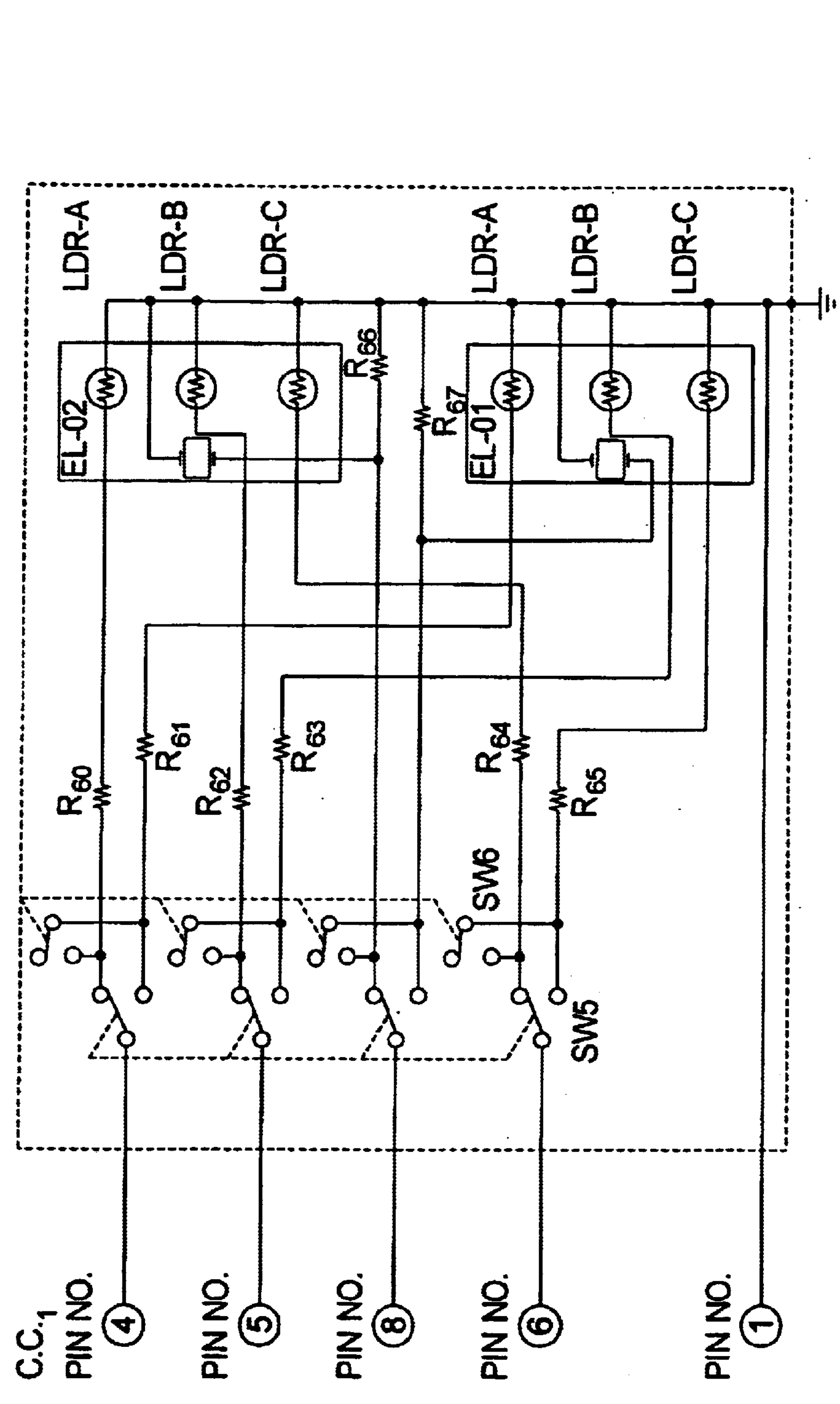
FIG. 8 is a circuit diagram of an electroluminescent differential photocell attenuator array.

FIG. 8 shows a circuit diagram with an array of electroluminescent differential photocell attenuators of an operational embodiment. Four input leads 4, 5, 6, and 8 are provided connected to two four pole switches SW5 and SW6. A further input lead 1 is connected to ground. By the operation of the switches SW5 and SW6, the operator may make a selection of light sources and light dependent resistors. From the switches SW5 and SW6, a number of resistors are connected, including from input lead 4 resistors R60 and R61, from input lead 5 resistors R62 and R63, from input lead 6 resistors R64 and R65, and from input lead 8 resistors R66 and R67.

The resistor R60 connects to a light dependent resistor LDR-A linked to an electroluminescent module EL-02. The resistor R61 connect to a light dependent resistor LDR-B linked to an electoluminescent module EL-01, while the resistor R64 connect to the third light dependent resistor LDR-C in that module for independent meter circuit control. Module EL-01 is provided with three light resistors LDR-A, LDR-B and LDR-C as well which are connected to respective ones of the resistors R61, R63, and R65. The electroluminescent modules EL-01 and EL-02 each include photosensitive elements which are connected to the switches SW5 and SW6 leading from pin 8.

In the switch positions shown in FIG. 8, the module EL-02 is active and the module EL-01 is inactive. In the module EL-02, all three of the light dependent resistors LCR-A, B and C are connected to the input pins. By operating the switch SW5 to the other position, the module EL-02 is disabled and the module EL-01 is activated. Operation of the switch SW6 to the other position, regardless of the position of the switch SW5, causes both modules EL-01 and EL-02 to become active. This circuit is utilized in a larger overall device, as shown in FIG. 9.

Figure 9A:
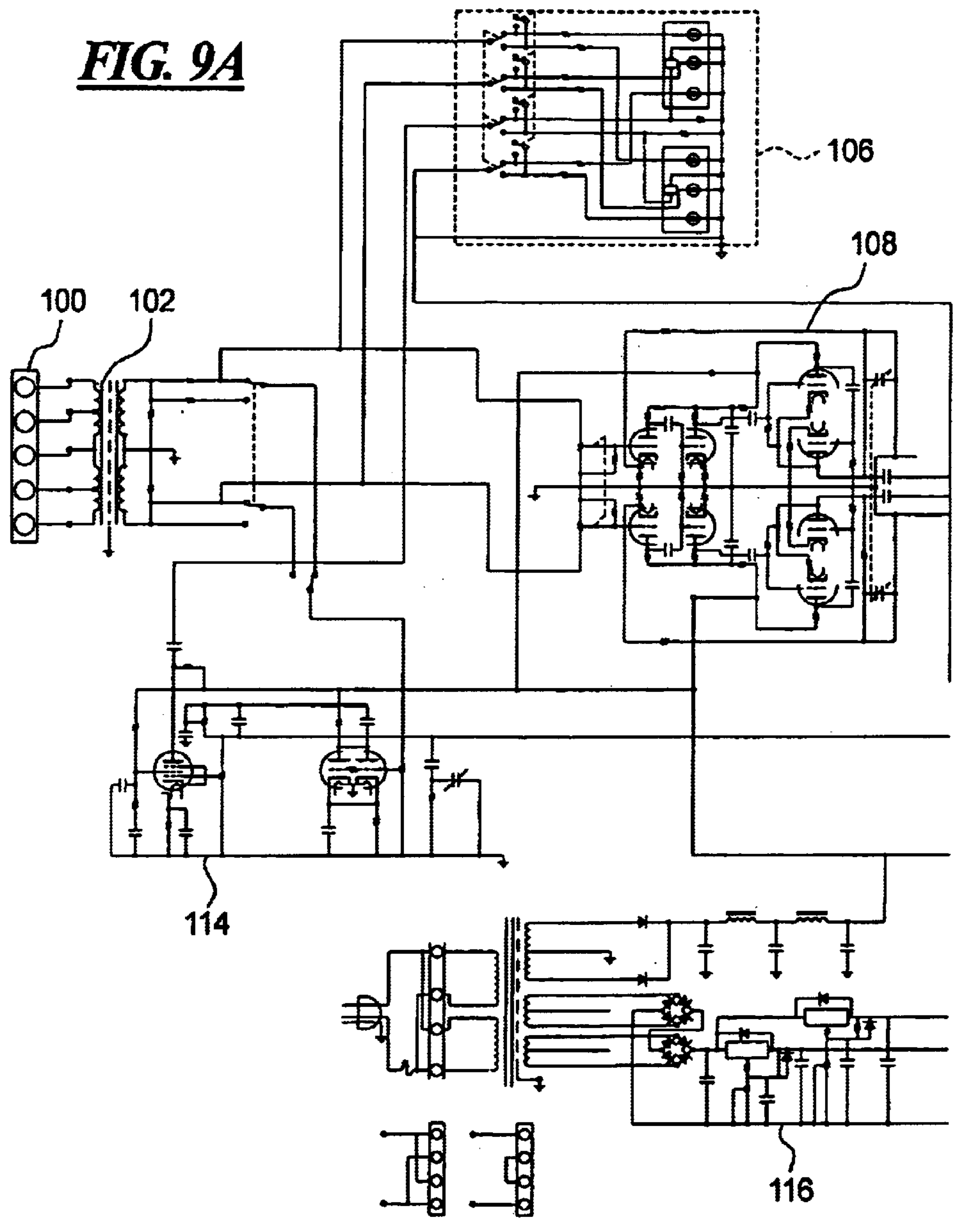
FIGS. 9*a* and 9*b* are circuit diagrams of an actual operational embodiment of a differential gain adjusting amplifier utilizing the present invention.
Figure 9B:
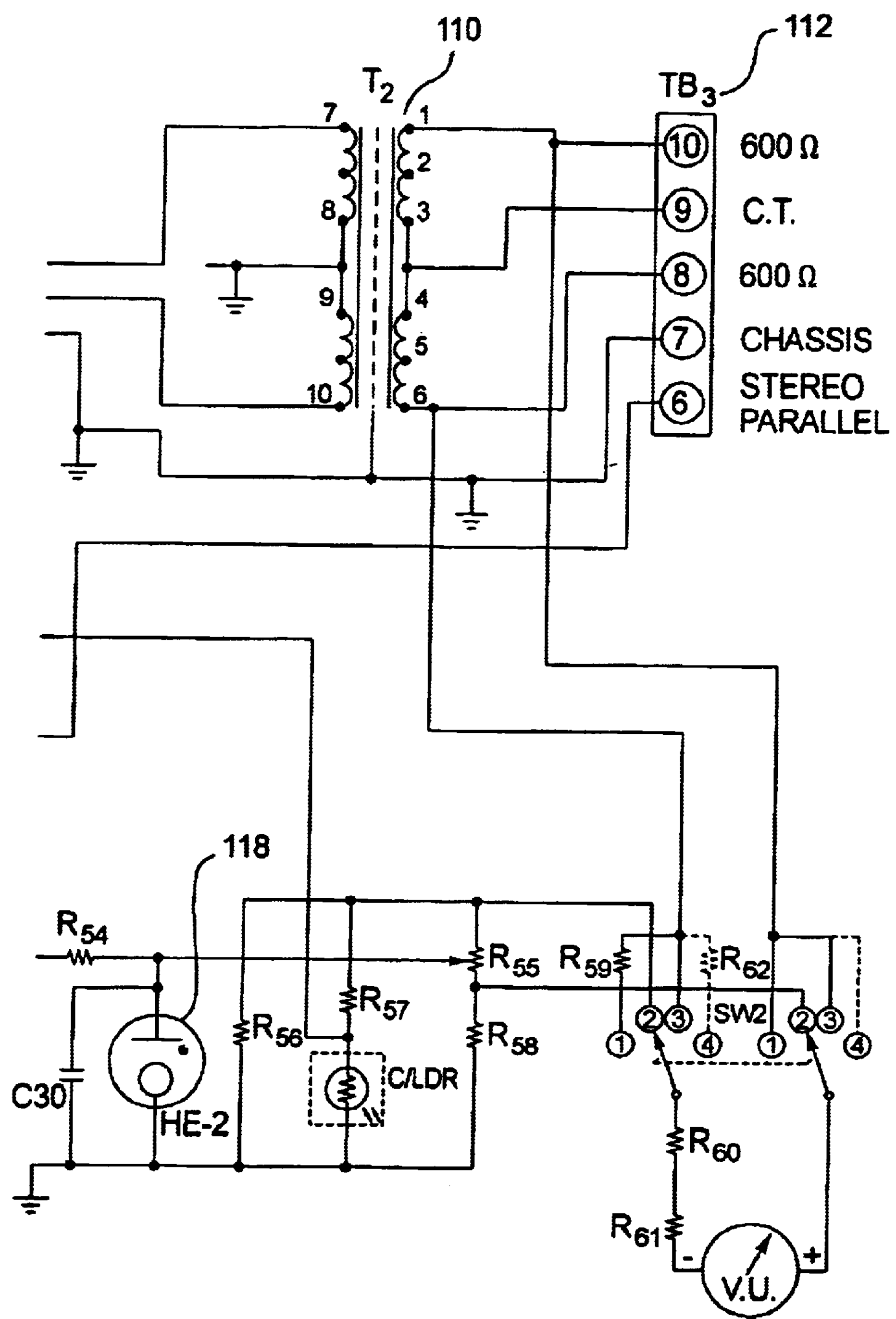

In FIG. 9, an actual embodiment of a differential gain adjusting amplifier is shown. In the Figure, an input block 100 is connected through a differential transformer 102 to a pair of switches 104. The outputs of the transformer are also connected to two inputs of the electroluminescent differential photocell attenuator array 106 as shown in FIG. 8. The differential transformer 102 outputs are connected to a differential amplifier portion 108, the output of which is connected to a further differential transformer 110 and then to an output block 112.

The light sensor output of the differential photocell attenuator array 106 is connected to a feedback control portion 114 which provides a signal to the amplifier portion 108 so that the output of the amplifier portion 108 is varied in inverse response to increases in the input signal level. At the lower portion of the circuit is a power supply portion 116 with a transformer and bridge rectifiers. Various user controls 118 are provided for the circuit as well.

Additional details of the embodiment of FIG. 9 will be apparent to those of skill in the art, and so are not set forth in further detail here.

Variable gain amplifier systems can be utilized to control multiple channel outputs. The amplifier control module has triple gain stage amplifiers which are essentially independent of each other. One three stage amplifier is provided for audio throughput while the other three stage amplifier is dedicated to voltage amplification for the illumination of the electroluminescent light sources for the variable gain components. This enables multiple channels for the control amplifiers to be interconnected, giving multi-channel applications the ability to reduce signals through all amplifiers interface in a parallel format with respect to their control amplifiers. Any variation of the signals being amplified by one amplifier will not only effect the gain of any one amplifier but also will effect the gain of the others. The selectable electroluminescent light sources and the associated differential photoconductive cell arrays are mounted together in close proximity to one another within a light tight container. Great advantages are achieved by utilizing electroluminescent devices as the controllable light sources. The emission by the electroluminescent light sources is in direct linear proportion and is frequency sensitive to the exciting voltages applied thereto. In addition, the electroluminescent devices provide extremely quick response times. It is also envisioned in the present invention to utilize other light sources to produce linear emissions for increasing frequency/amplitude voltage applied to the device.

In one embodiment of the invention, the electroluminescent sources are provided by Luminescent Systems Incorporated, 4 Lucent Drive, Lebanon, N.H. 03766-1439. The photocells of the preferred embodiment are chosen from either Perkins-Elmer Applied Optics, 7421 Orangewood Avenue, Garden Grove, Calif. 92641 or Clairex Electronics, 560 South Third Avenue, Mt. Vernon, N.Y. 01550.

Although other modifications and changes may be suggested by those skilled in the art, it is the intention of the inventors to embody within the patent warranted hereon all changes and modifications as reasonably and properly come within the scope of their contribution to the art.

I claim:

1. A differential gain controlled amplifier, comprising:

an input transformer for receiving an input signal;

a differential control amplifier receiving the input signal from said input transformer, said differential control amplifier having an output;

at least one light source connected to said output of said differential control amplifier, said at least one light source generating illumination energy which varies in intensity in substantially linear relation to said input signal;

at least one photoconductive element optically coupled to said at least one light source; and a differential attenuating circuit connected to said at least one photoconductive element, said differential attenuating circuit having outputs from which output signals are available.

2. A differential gain controlled amplifier as claimed in claim 1, wherein said at least one photoconductive element is two photoconductive elements connected in a dual shunt configuration at differential input terminals of said differential attenuating circuit.

3. A differential gain controlled amplifier as claimed in claim 1, wherein said at least one photoconductive element is two photoconductive elements which are connected in series between two differential input terminals of said differential attenuating circuit.

4. A differential gain controlled amplifier as claimed in claim 2, wherein said differential attenuating circuit includes a dual bridge having two pairs of nodes across which occurs a differential voltage of a differential signal source, common terminals connecting differential ends of said pairs of nodes together;

impedance branches connected at said nodes and having dual differential taps;

a connection of a differential voltage at said differential taps to said differential input terminals; and said at least one photoconductive element being connected between said differential input terminals and said common terminals.

5. A differential gain controlled amplifier as claimed in claim 2, further comprising:

a floating bridge having a pair of branches across which occurs a differential voltage developed from a signal source, said branches having an impedance at opposite ends, said impedance having dual differential taps;

a connection of said dual differential taps to said differential input terminals;

said photoconductive elements being connected to both of said branches between both of said differential input terminals and a terminal of said input transformer.

6. A differential gain controlled amplifier as claimed in claim 5, wherein said floating bridge is a pair of bridges.

7. A differential gain controlled amplifier as claimed in claim 3, further comprising:

a floating bridge having a pair of branches across which occurs a differential voltage developed from a signal source, said branches having an impedance at opposite ends, said impedance having dual differential taps;

a connection of said dual differential taps to said differential input terminals;

said photoconductive elements being connected to both of said branches between both of said differential input terminals and a terminal of said input transformer.

8. A differential gain controlled amplifier as claimed in claim 7, wherein said floating bridge is a pair of bridges.

9. A differential gain controlled amplifier as claimed in claim 5, further comprising:

a single element differential photoconductive resistive network having a single element, said single element being optically connected to said at least one light source.

10. A differential gain controlled amplifier as claimed in claim 4, wherein said input transformer is a floating differential transformer having windings connected at a primary winding node to respond to a signal source and connected at a secondary winding node to said two pairs of nodes, said impedance branches including a first resistance and a photoconductive element and a second resistance connect in series, said impedance branches being connected between two secondary winding nodes of said floating differential transformer.

11. A balanced differential network having a gain controlled in response to frequency and amplitude of an audio input signal, comprising:

a constant fixed gain differential amplifier having inputs connected for response to said audio input signal, said differential amplifier having an output which is substantially identical to said audio input signal applied to said inputs;

a set of selectable solid state electroluminescent light sources connected to said output of said differential amplifier to react to frequency and amplitude of a signal from said output of said differential amplifier, said light sources having an output of an intensity which is substantially linearly related to the frequency and amplitude of an output signal; and a differential attenuating network connected to receive said audio input signal and generate a differential signal therefrom, said differential attenuating network being connected to said inputs of said differential amplifier to apply said differential signal to said inputs of said differential amplifier so that said differential amplifier responds to variations in frequency and amplitude of said differential signal, said differential attenuating network including at least one photoconductive resistive element that is optically coupled to respond to light from said light sources.

12. A balanced differential network as claimed in claim 11, wherein said photoconductive resistive element includes two photoconductive resistive elements connected in a dual shunt configuration having differential input terminals connected to said differential amplifier.

13. A balanced differential network as claimed in claim 11, wherein said photoconductive resistive element includes two photoconductive resistive elements connected in series between said inputs of said differential amplifier and said audio input signal.

14. A balanced differential network as claimed in claim 11, wherein said differential attenuating network includes:

dual bridges having two pairs of nodes, each of said two pairs of nodes providing the differential signal of said differential attenuating network;

a pair of common terminals connecting differential ends of said two pairs of nodes;

impedance branches having dual taps connected to each of said branches;

a connection between said dual taps.

* * * * *